(12) United States Patent
Yu et al.

(10) Patent No.: US 12,732,767 B2
(45) Date of Patent: Sep. 8, 2026

(54) VEHICLE-MOUNTED SOUND REPRODUCTION SIGNAL DELAY METHOD ADAPTED TO LISTENING CENTER POSITION

(71) Applicant: SOUTH CHINA UNIVERSITY OF TECHNOLOGY, Guangzhou (CN)

(72) Inventors: Guangzheng Yu, Guangzhou (CN); Wei Tan, Guangzhou (CN); Linda Liang, Guangzhou (CN); Tong Zhao, Guangzhou (CN); Shuo Li, Guangzhou (CN); Jiawen Cai, Guangzhou (CN); Kun Xing, Guangzhou (CN)

(73) Assignee: SOUTH CHINA UNIVERSITY OF TECHNOLOGY, Guangzhou (CN)

( * ) Notice: Subject to any disclaimer, the term of this patent is extended or adjusted under 35 U.S.C. 154(b) by 358 days.

(21) Appl. No.: 18/281,571

(22) PCT Filed: Oct. 31, 2021

(86) PCT No.: PCT/CN2021/127804
§ 371 (c)(1),
(2) Date: Jul. 16, 2024

(87) PCT Pub. No.: WO2022/188434
PCT Pub. Date: Sep. 15, 2022

(65) Prior Publication Data

US 2025/0324211 A1 Oct. 16, 2025

(30) Foreign Application Priority Data

Mar. 12, 2021 (CN) ........................ 202110271857.7

(51) Int. Cl.
*H04S 7/00* (2006.01)
*H04R 5/02* (2006.01)
(Continued)

(52) U.S. Cl.
CPC .............. *H04S 7/301* (2013.01); *H04R 5/02* (2013.01); *H04S 3/008* (2013.01); *H03F 3/21* (2013.01);
(Continued)

(58) Field of Classification Search
CPC ...................................................... H04S 7/301
See application file for complete search history.

(56) References Cited

U.S. PATENT DOCUMENTS 8,306,236 B2 * 11/2012 Asada .................... H04R 29/00 381/26
8,315,401 B2 * 11/2012 Hayakawa ............... H04R 3/12 381/86
(Continued)

FOREIGN PATENT DOCUMENTS

CN 104469623 3/2015
CN 109976701 7/2019
(Continued)

OTHER PUBLICATIONS

Michael J. Smithers, "Improved Stereo Imaging in Automobiles," Audio Engineering Society Convention Paper 7223, Presented at the 123rd Convention, Oct. 2007, pp. 1-8.
(Continued)

*Primary Examiner* — Paul W Huber
(74) *Attorney, Agent, or Firm* — JCIPRNET

(57) ABSTRACT

Disclosed is a vehicle-mounted sound reproduction signal delay method adapted to a listening center position. The method includes the following steps: presetting a coordinate reference system to acquire coordinates of each loudspeaker unit, and setting position coordinates of an initial listening center to acquire an initial distance parameter set for signal processing of a vehicle-mounted sound reproduction system; measuring and acquiring an impulse response from
(Continued)

each loudspeaker unit to the initial listening center, and extracting and obtaining an initial delay parameter set; acquiring position coordinates of a new listening center in a specific manner, and acquiring a distance parameter set of each loudspeaker unit relative to the new listening center; and generating optimized delay parameters adapted to a new listener based on the distance parameter set relative to the new listening center.

16 Claims, 4 Drawing Sheets

(51) Int. Cl.
*H04S 3/00* (2006.01)
*H03F 3/21* (2006.01)

(52) U.S. Cl.
CPC ...... *H03F 2200/03* (2013.01); *H04R 2499/13* (2013.01); *H04S 2400/01* (2013.01); *H04S 2400/11* (2013.01); *H04S 2400/15* (2013.01)

(56) References Cited

U.S. PATENT DOCUMENTS 9,813,835 B2 * 11/2017 Christoph ............... H04S 7/305
11,012,801 B2 * 5/2021 Takahashi ............... H04S 7/302
2005/0244012 A1 * 11/2005 Asada ..................... H04S 7/301
381/98
2011/0268298 A1 * 11/2011 Imanishi ................... H04S 7/00
381/303
2016/0337741 A1 11/2016 Amarilio et al.

FOREIGN PATENT DOCUMENTS

CN 110377265 10/2019
CN 113115199 7/2021

OTHER PUBLICATIONS

"International Search Report (Form PCT/ISA/210) of PCT/CN2021/127804," mailed on Jan. 19, 2022, with English translation thereof, pp. 1-4.

* cited by examiner

VEHICLE-MOUNTED SOUND REPRODUCTION SIGNAL DELAY METHOD ADAPTED TO LISTENING CENTER POSITION

CROSS-REFERENCE TO RELATED APPLICATION

This application is a 371 of international application of PCT application serial no. PCT/CN2021/127804, filed on Oct. 31, 2021, which claims the priority benefit of China application serial no. 202110271857.7, filed on Mar. 12, 2021. The entirety of each of the above-mentioned patent applications is hereby incorporated by reference herein and made a part of this specification.

TECHNICAL FIELD

The present invention relates to the field of sound reproduction of automobiles, and particularly relates to a vehicle-mounted sound reproduction signal delay method adapted to a listening center position.

BACKGROUND

A sound reproduction system of an automobile is a device which receives and reproduces sounds to alleviate the boring feelings of drivers and passengers in riding. An amplitude modulation radio, an amplitude modulation and frequency modulation radio, and a tape radio for automobiles are used at the earliest. Later, a CD player and digital multimedia audio and video entertainments compatible with DCC, DAT, and the like are developed. With the development of information technology, the sound reproduction system of the automobile further needs to support various program sources with special systems such as double-channel stereo, 5.1 channel surround sounds, and other multi-channel sounds.

An acoustic space of the automobile can be a closed (with windows closed) or semi-closed (with windows opened) acoustic space, and sound waves of a sound source (with a certain directivity) are overlapped to both ears by way of direct sounds and reflected sounds. The direct sounds can be roughly decided according to the geometrical positional relationship between reproduction loudspeaker units and target listeners (may be the driver or passengers), and the reflected sounds are from surfaces of a windshield, windows, a ceiling, a floor, and the like. In a stereo and multi-channel sound reproduction system, with respect to processing of the direct sound waves and the reflected sound waves, there are the following differences between vehicle-mounted sound reproduction and household sound reproduction:

Processing of the direct sound waves: in a conventional indoor sound reproduction system, a spatial symmetrical arrangement based on a central listening sweet zone is usually adopted. However, as the seats in the automobile are fixedly arranged, the passengers (listeners) are deviated from the center position, and the listeners at different seats are very close to different loudspeaker units (the transmission distances between the loudspeakers of the channels to the listeners are different), which brings difficulty to signal processing of the multi-channel sound reproduction. It is an almost impossible to design a multi-channel sound reproduction solution which considers all seats. There are often solutions as follows: (1) the listener at a certain seat is considered by a channel delay adjusting method, i.e., the optimal listening effect is only created for a target listener; and (2) the listeners at all seats are considered, i.e., a conventional sound reproduction method is adopted, but the effect at each listening position is not the optimum as the listeners are not at the center position.

Processing of the reflected sound waves: in a conventional indoor sound reproduction system, as the reflected sounds are unfavorable for the multi-channel sound reproduction system, influence of the reflected sounds needs to be reduced as far as possible by means of sound absorption, and the like. However, in a small acoustic space in the automobile, in addition to inevitable near-distance reflection boundaries such as windshield and windows, there are following conditions: (1) sound field characteristics such as rapid attenuation of low frequency standing waves and high frequency standing waves are significantly different from those in a large space; (2) owing to asymmetrical arrangement of the seats in the automobile, the passengers (listeners) at different seats are close to different reflecting surfaces; and (3) the sound field conditions in reproduction zones in front and back rows are different as a result of reflection by the seats in the front row and shielding of the seats. A usual solution is to adopt a certain equilibrium processing method and to optimize or compromise the sound reproduction effects at different positions within a reasonable physical acoustic conditional range.

Besides the differences between the above vehicle-mounted sound reproduction and the conventional household sound reproduction, with limitation of the acoustic space of the automobile, there are also problems or difficulties as follows:

Position separation of the frequency division loudspeakers: the frequency division technology is a frequently used technical means of a loudspeaker system, which aims to enhance the radiated sound pressure level (dynamic range) as far as possible without loss of the frequency response range of the loudspeaker, thereby meeting the requirements on acoustic parameters in different sound reproduction fields. In vehicle-mounted sound reproduction, as a result of limitation in the acoustic space (including the thickness of the automobile body and the space in the automobile) in the automobile, the placing space of the loudspeaker units is limited, so the frequency response characteristics of the loudspeakers related to the dimensions of the loudspeaker units are also affected. When the solution of the frequency division loudspeakers is adopted, the frequency division loudspeaker units are separately arranged at different positions in the automobile to optimize the sound radiation frequency response characteristic and the radiated sound pressure level dynamic range of the vehicle-mounted sound reproduction loudspeaker system. Due to limitation of the environment in the automobile, the frequency division loudspeaker units are hugely separated in the spatial position (including (1) the height position separation relative to a floor panel and (2) separation in short and long distances relative to the target listener), so that the flare angel and the distance differences of the frequency division loudspeaker units relative to the center position of the head of the target listener cannot be ignored, which are greatly different from the frequency division loudspeaker units for the conventional indoor multi-channel sound reproduction system, thereby bringing a further difficulty to corresponding signal processing. In case of improper design, the reproduction effect will even be affected destructively.

Personalized differences of the target listener: different occupants (the target listeners such as the driver or the passengers) are different in height, body form, riding habit, and the like, which will cause differences in the personalized head center positions of different occupants, resulting in changes of spatial asymmetrical angle values and transmission distance differences from the above different channels (and different frequency division loudspeaker units) to the target listeners. It means that signal parameters based on the target listener A are not adapted to the target listener B (in consideration of meeting the individual demands of different drivers theoretically in the same automobile) or there are personalized differences on sound signal processing parameters among different target listeners. It is just the starting point and the stance of the solution provided by the present invention, i.e., based on differences of different users, a good reproduction effect for different users (listeners) can be achieved by a self-adapted vehicle-mounted sound reproduction signal processing method.

An existing literature has proposed a solution for the vehicle-mounted sound reproduction system with a certain listener deviated from the center position (see the literature: Smithers M J. *Improved stereo imaging in automobiles*[C]// *Audio Engineering Society Convention* 123. *Audio Engineering Society,* 2007). However, in the method, the target listeners with different heights, body forms and riding habits are not changed or adjusted correspondingly.

In conclusion, the change of the listening center position caused by the differences on height, body form, riding habit, and the like of different occupants will cause changes of position differences of the channels relative to the listeners and position differences of the frequency division loudspeaker units relative to the listeners, so that the delay parameters of the channels are set inaccurately in the vehicle-mounted sound reproduction system, which causes the instability (or inconsistency) of the reproduction effect among different listeners. However, the problem has been neither taken into consideration by researches yet nor solved well.

SUMMARY

The present invention relates to a vehicle-mounted sound reproduction system, and particularly relates to a vehicle-mounted sound reproduction signal delay method adapted to a listening center position. First, a reference system is defined in an acoustic space of an automobile, coordinates of a spatial position of each loudspeaker unit in the vehicle-mounted sound reproduction system are measured and acquired based on the reference system, and a coordinate set of a listening center is preset to acquire an initial distance parameter set for signal processing of a vehicle-mounted sound reproduction system. Then a microphone is placed at the preset target listening center position to acquire sound transmission characteristic (impulse response) between each loudspeaker unit and the center position in sequence by microphone pickup, and an initial delay time of feed signals of each loudspeaker unit is extracted and obtained based on the transmission characteristic. Finally, after a special listener (for example, a driver or a passenger) adjusts the seat and the back, coordinates of the personalized listening center position are acquired in a proper manner to calculate the actual distance between the listener and each loudspeaker unit, and the actual distances and the initial distance data together constitute a distance difference parameter seat for creating a better spatial auditory reproduction effect for the target listener by selecting the center position when optimizing the actual delays of the channels and the frequency division loudspeaker units of the vehicle-mounted sound reproduction system.

The objective of the present invention is at least realized by one of the technical solutions as follows:

A vehicle-mounted sound reproduction signal delay method adapted to a listening center position, including the following steps:

S1: presetting a coordinate reference system to acquire coordinates of each loudspeaker unit, and setting position coordinates of an initial listening center to acquire an initial distance parameter set for signal processing of a vehicle-mounted sound reproduction system;

S2: measuring and acquiring an impulse response from each loudspeaker unit to the initial listening center, and extracting and obtaining an initial delay parameter set;

S3: acquiring position coordinates of a new listening center in a specific manner (including, but not limited to, a position sensor, an infrared distance sensor, and a laser ranging device), and acquiring a distance parameter set of each loudspeaker unit relative to the new listening center; and

S4: generating optimized delay parameters adapted to a new listener based on the distance parameter set relative to the new listening center.

Further, in the step S1, a coordinate system (O-xyz) of the vehicle-mounted sound reproduction system is preset without loss of generality, an origin O of coordinates is a center of a cushion of a driver seat placed at a foremost end and located at the lowest position, an x axis points to a front of the driver seat from the origin of coordinates, a y axis points to a passenger seat position from the origin of coordinates, and a z axis is perpendicular upwards.

The vehicle-mounted sound reproduction system refers to a multichannel sound reproduction system in an automobile, which provides passengers in the automobile with a spatial auditory reproduction effect and is usually composed of a sound source provided by a central control center control, frequency division and delay signal processing, a power amplifier, loudspeaker units (groups), and the like.

Further, based on the coordinate system (O-xyz), coordinates $S_{ij}(x_{ij}, y_{ij}, z_{ij})$ of a center position of each loudspeaker unit are measured and acquired, and $x_{ij}$, $y_{ij}$, and $z_{ij}$ are spatial position coordinates of each loudspeaker unit in the coordinate system of the vehicle-mounted sound reproduction system in a compartment, where i represents a sequence number of different channel orientations, i={FR, FL, FC, BR, BL, SW, S}, FR, FL, FC, BR, BL, SW, and S respectively correspond to a front right loudspeaker, a front left loudspeaker, a front center loudspeaker, a back right loudspeaker, a back left loudspeaker, an sub-woofer loudspeaker, and other expandable loudspeaker units; j represents a frequency division sequence number of each channel, j={L, M, H}, and L, M, and H respectively correspond to a low frequency loudspeaker unit, a medium frequency loudspeaker unit, and a high frequency loudspeaker unit;

in the preset coordinate system (O-xyz), the position of the initial listening center is set as $$C_0^k(x_0^k, y_0^k, z_0^k),$$

wherein the driver seat corresponds to k=1, and a passenger seat corresponds to k=2; and to acquire a better initial listening center position, according to a height $h_0$ of an upper part of a body of a human in a sitting posture, an equivalent head radius $a_0$, a seat back inclination angle $\varphi_0$ (representing that the seat back and the z axis form an included angle $\varphi_0$), a back stroke $x_0$ of the seat and a lift $z_0$ of the seat, the coordinates of the initial listening center are jointly determined specifically as follows:

$$x_0^k = x_0 - (h_0 - a_0)\sin(\varphi_0),\ k = 1, 2,\ x_0 \le 0;$$

$$y_0^{(k=1)} = 0,\ y_0^{(k=2)} = -y_0,\ \ y_0 = \left|C_0^{(1)}C_0^{(2)}\right|;$$

$$z_0^k = z_0 + (h_0 - a_0)\cos(\varphi_0),\ k = 1, 2,\ \ z_0 \ge 0.$$

Further, the distance parameter set $$\{|C_0^k S_{ij}|\}$$

of each loudspeaker unit relative to the initial listening center is obtained according to a distance formula between coordinates of two points.

Further, in the step S2, under actions of a sound card and a power amplifier of the vehicle-mounted sound reproduction system, different loudspeaker units are driven in sequence with a same information source strength, so that a sound transmission characteristic, i.e., an impulse response, from each loudspeaker unit to the initial listening center position $$C_0^k$$

is measured; and the initial delay parameter set $$\{\tau_{ij}^k\}$$

is acquired based on the impulse response and is verified with the distance parameter set $$\{|C_0^k S_{ij}|\}$$

relative to the initial listening center, wherein k represents a target seat, i represents the sequence number of different channel orientations, and j represents the frequency division sequence number of each channel.

Further, if a relative delay between the frequency division loudspeakers is not considered, the initial delay parameter set is a delay $$\{\tau_{iH}^k\}$$

of a high frequency channel, where i represents the sequence number of different channel orientations, k represents the target seat, and the frequency division sequence number j of each channel is equal to H.

Further, in the step S3, the position coordinates of the listening center corresponding to the $n^{th}$ new listener, i.e., the $n^{th}$ new listening center are acquired in a specific manner as $$C_n^k(x_n^k,\ y_n^k,\ z_n^k),$$

specifically as follows:

assuming that the height from both ears of the $n^{th}$ new listener to the cushion is $h_n$, the equivalent head radius is $a_n$, the seat back inclination angle is $\varphi_n$, the back stroke of the seat is $x_n$, and the lift of the seat is $z_n$, the coordinates of the listening center corresponding to the $n^{th}$ new listener are represented as:

$$x_n^k = x_n - (h_n - a_n)\sin(\varphi_n),\ k = 1, 2,\ x_n \le 0;$$

$$y_n^{(k=1)} = 0,\ y_n^{(k=2)} = -y_0,\ \ y_0 = \left|C_n^{(1)}C_n^{(2)}\right| = \left|C_0^{(1)}C_0^{(2)}\right|;$$

$$z_n^k = z_n + (h_n - a_n)\cos(\varphi_n),\ k = 1, 2,\ z_n \ge 0;$$

the distance parameter set $$\{|C_n^k S_{ij}|\}$$

of each loudspeaker unit relative to the $n^{th}$ new listening center are acquired based on the coordinates $$C_n^k(x_n^k,\ y_n^k,\ z_n^k)$$

of the listening center corresponding to the $n^{th}$ new listener and the coordinates $S_{ij}(x_{ij}, y_{ij}, z_{ij})$ of the center position of each loudspeaker unit.

Further, in the step S4, the optimized delay parameters adapted to the personalized listening center of the $n^{th}$ new listener are obtained according to the initial distance parameter set $$\{|C_0^k S_{ij}|\},$$

acquired in the step S1, the initial delay parameter set $$\{\tau_{ij}^k\} \text{ or } \{\tau_{iH}^k\}$$

acquired in the step S2, and the distance parameter set $$\{|C_n^k S_{ij}|\}$$

of each loudspeaker unit relative to the $n^{th}$ new listening center acquired in the step S3, as shown in the following equation:

$$\tau_{ij}^{nk} = \left(|C_0^k S_{ij}| - |C_n^k S_{ij}|\right)/c_0 + \tau_{ij}^k;$$

where $c_0$ represents a sound velocity in air.

Further, when a delay difference between the frequency division loudspeaker units is not considered and only a high frequency channel delay is processed, the optimized delay parameters adapted to the personalized listening center of the $n^{th}$ new listener are:

$$\tau_i^{nk} = \left(|C_0^k S_{iH}| - |C_n^k S_{iH}|\right)/c_0 + \tau_{iH}^k.$$

Further, the optimized delay parameters are stored in the vehicle-mounted reproduction system, are measured and optimized as needed in actual use or are selected directly according to a usage record; and when the optimized delay parameters are not needed to be optimized, the initial delay parameter is taken as a default parameter.

DETAILED DESCRIPTION OF EMBODIMENTS

The present invention will be further described in detail below in combination with specific embodiments and drawings, but implementation modes of the present invention are not limited thereto.

Embodiment

Figure 1:
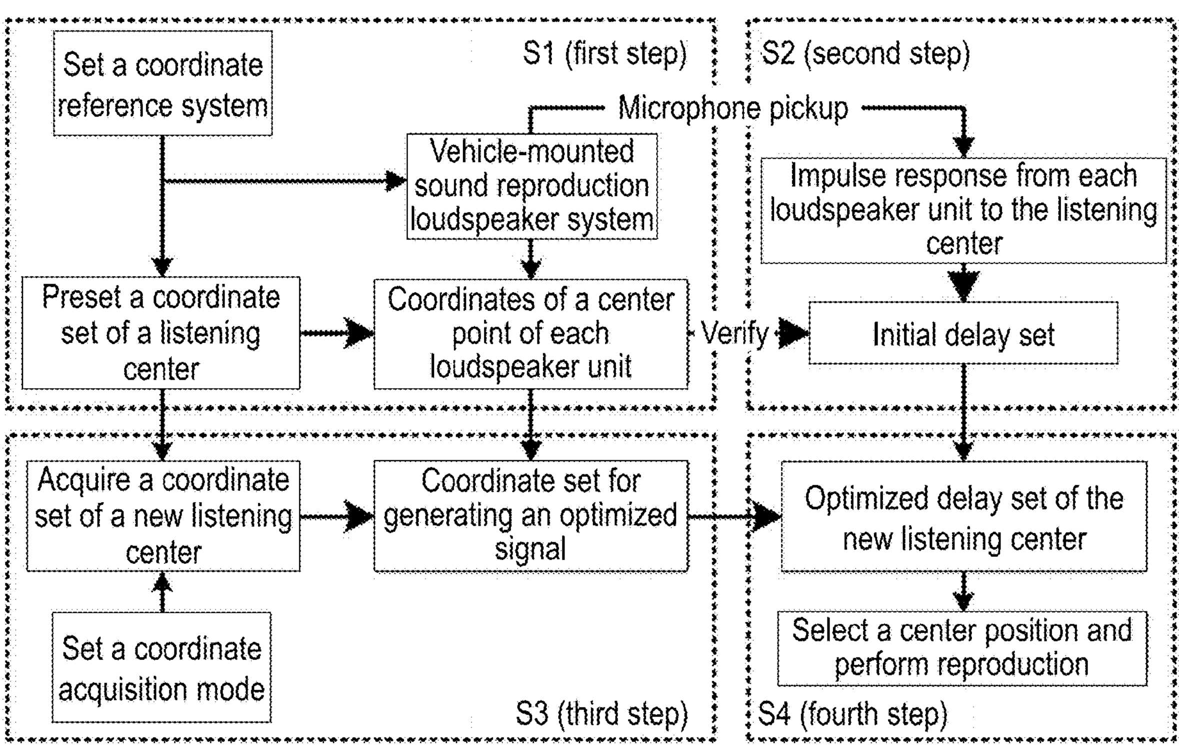
FIG. 1 is a schematic diagram of a vehicle-mounted sound reproduction system adapted to a listening center position.
Figure 2A:
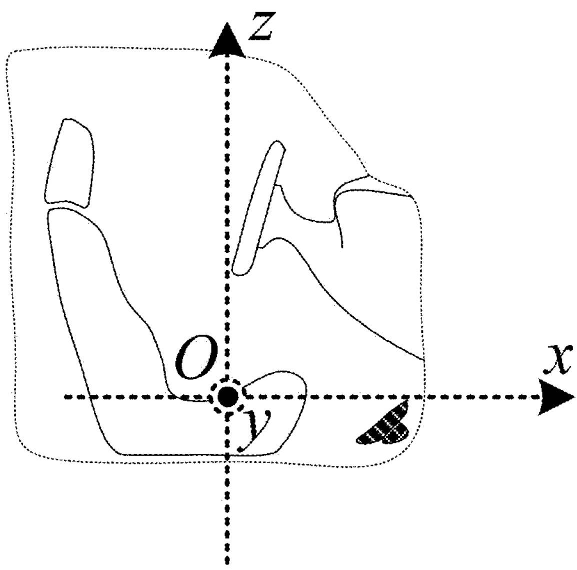
FIG. 2*a* is a schematic diagram of a coordinate reference system.

A vehicle-mounted sound reproduction signal delay method adapted to a listening center position, as shown in FIG. 1, including the following steps:

S1: a coordinate reference system is preset to acquire coordinates of each loudspeaker unit, and position coordinates of an initial listening center are set to acquire an initial distance parameter set for signal processing of a vehicle-mounted sound reproduction system;

as shown in FIG. 2*a*, a coordinate system (O-xyz) of the vehicle-mounted sound reproduction system is preset without loss of generality, an origin O of coordinates is a center of a cushion of a driver seat placed at a foremost end and located at the lowest position, an x axis points to a front of the driver seat from the origin of coordinates, a y axis points to a passenger seat position from the origin of coordinates, and a z axis is perpendicular upwards;

the vehicle-mounted sound reproduction system refers to a multichannel sound reproduction system in an automobile, which provides passengers in the automobile with a spatial auditory reproduction effect and is usually composed of a sound source provided by a central control center control, frequency division and delay signal processing, a power amplifier, loudspeaker units (groups), and the like.

At present, various types of vehicle-mounted sound reproduction systems have been applied maturely on massively produced automobiles such as Burmester® High-End 3D-Surround-Soundsystem carried on Mercedes-Benz E-class, ELS STUDIO 3D carried on Acura RDX, and Bowers & Wilkins Diamond Surround Sound System carried on BMW 7-series. In a similar manner, corresponding changes or adjustments on the target listeners with different heights, body forms and riding habits are not involved in these maturely applied vehicle-mounted sound reproduction systems.

Figure 2B:
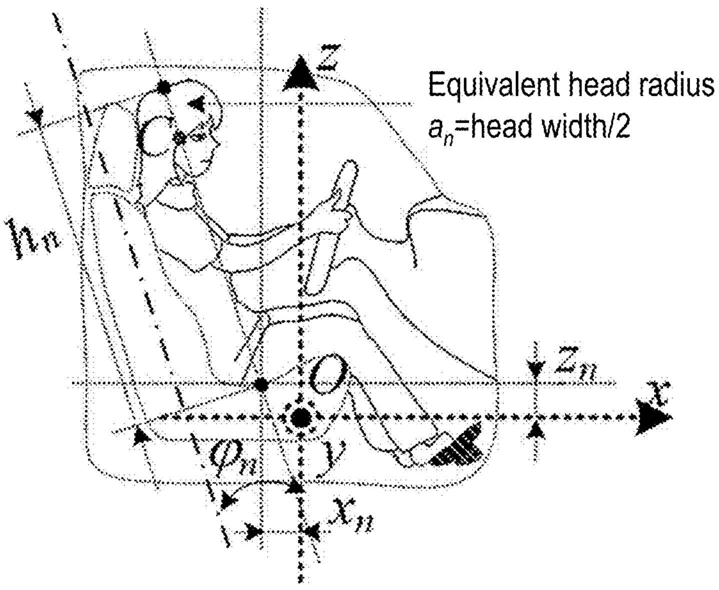
FIG. 2*b* is a schematic diagram of parameters at an initial listening center position.

In the preset coordinate system (O-xyz), the position of the initial listening center is set as $$C_0^k(x_0^k, y_0^k, z_0^k),$$

wherein the driver seat corresponds to k=1, and a passenger seat corresponds to k=2;

to acquire a better initial listening center position, in the embodiment, as shown in FIG. 2*b*, with reference to national standard GB/T 10000-1988, a median height $h_0$=0.908 m of the upper part of the body of a Chinese, an equivalent head radius $a_0$=0.088 m, a moderate back stroke of the seat $x_0$=0.085 m, the lift stroke of the seat $z_0$=0, and the optimum seat back inclination angle $\varphi_0$=16° (representing that the ergonomic seat back and the z axis form an included angle $\varphi_0$) are acquired, so that the coordinates of the preset listening center position $$C_0^{k=1}$$

Figure 3:
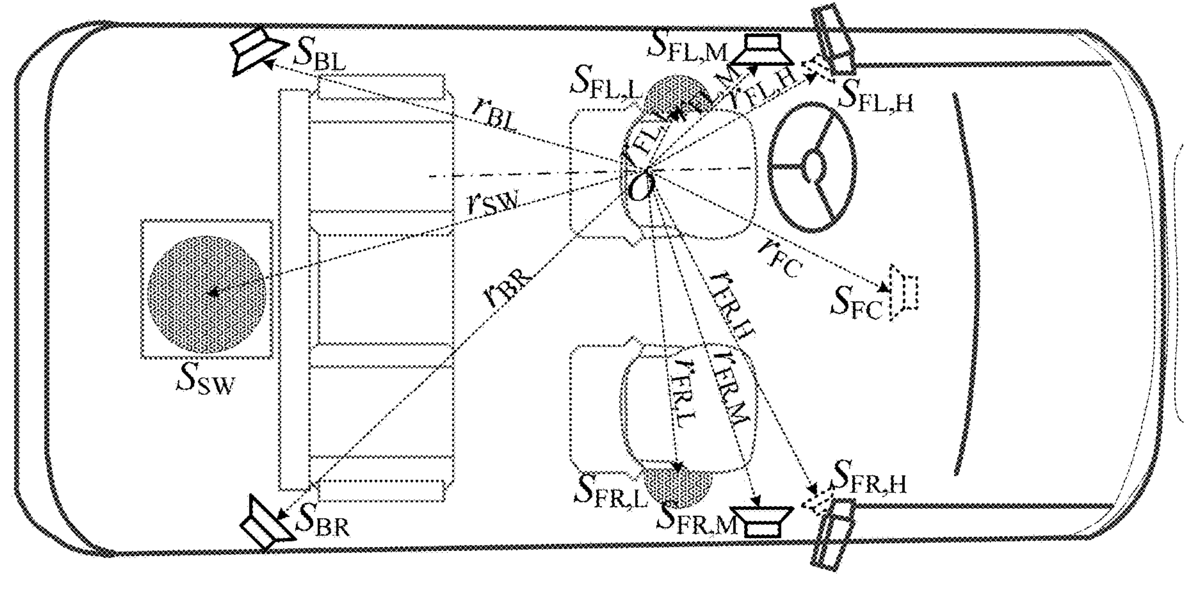
FIG. 3 is a top view of each unit position of a vehicle-mounted sound reproduction loudspeaker system.
Figure 4:
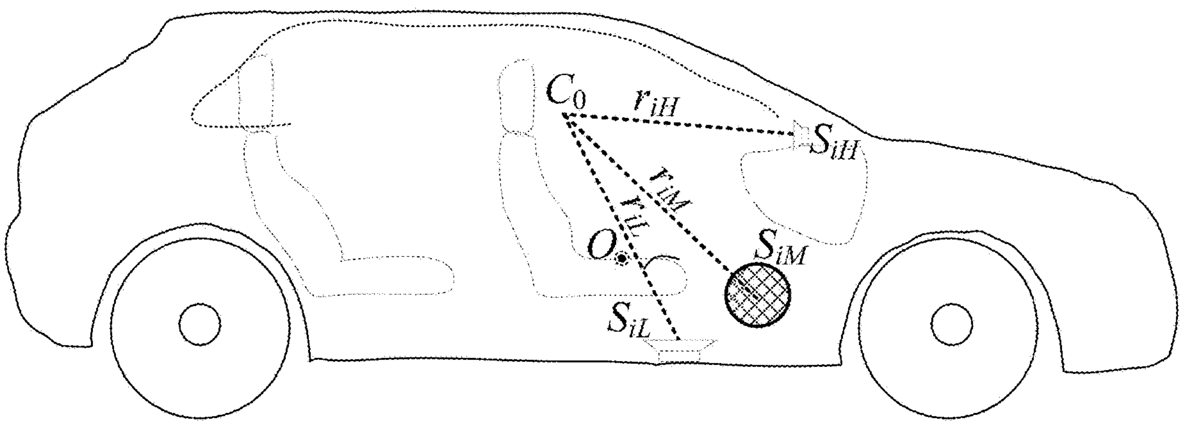
FIG. 4 is a side view of a position of a frequency division loudspeaker unit of the vehicle-mounted sound reproduction loudspeaker system.

(corresponding to the driver position) are approximated to (−0.311, 0, 0.788);

in an embodiment, as an example of a certain automobile model, the arrangement mode of loudspeakers in the automobile is 5.1 sound track ambiophonic system, wherein loudspeakers on the left side and right side of the front row and the middle loudspeaker are respectively located at automobile doors on both sides, a pillar A, and a center position of an instrument board; left and right surround loudspeakers are respectively located on the automobile door in the back row of the driver side and the automobile door in the back row of the passenger side; and the super bass loudspeaker is located in a trunk of the automobile, as shown in FIG. 3 and FIG. 4. Based on the coordinate system (O-xyz) in FIG. 2, coordinates $S_{ij}(x_{ij}, y_{ij}, z_{ij})$ of a center position of each loudspeaker unit are measured and acquired, and $x_{ij}$, $y_{ij}$, and $z_{ij}$ are spatial position coordinates of each loudspeaker unit in the coordinate system of the vehicle-mounted sound reproduction system in a compartment, where i represents a sequence number of different channel orientations, i={FR, FL, FC, BR, BL, SW, S}, FR, FL, FC, BR, BL, SW, and S respectively correspond to a front right loudspeaker, a front left loudspeaker, a front center loudspeaker, a back right loudspeaker, a back left loudspeaker, an sub-woofer loudspeaker, and other expandable loudspeaker units; j represents a frequency division sequence number of each channel, j={L, M, H}, and L, M, and H respectively correspond to a low frequency loudspeaker unit, a medium frequency loudspeaker unit, and a high frequency loudspeaker unit;

By taking a listening position of a driver (k=1) as an example, coordinates $(x_{ij}, y_{ij}, z_{ij})$ of the center position $S_{ij}$ of each loudspeaker unit are acquired, including $S_{FL,H}$=(0.200, −0.280, 0.520), $S_{FL,M}$=(0.220, −0.300, 0.460), $S_{FL,L}$=(0.060, 0, −0.180), $S_{FR,H}$=(0.200, 0.980, 0.520), $S_{FR,M}$=(0.220, 1.000, 0.460), $S_{FR,L}$=(0.060, 0.810, −0.180), $S_{FC}$=(0.155, 0.350, 0.440), $S_{BL}$=(−0.810, −0.350, −0.065), $S_{BR}$=(−0.810, 1.050, −0.065), $S_{SW}$=(−1.800, 0.300, −0.080); and coordinates (−0.311, 0, 0.788) of the listening center position $$C_0^{k=1}$$

are preset.

In another embodiment, coordinates of the center position of each loudspeaker unit can be acquired based on the listening position (k=2) of the passenger.

The distance $$|C_0^{k=1}S_{ij}| = r_{ij}^k$$

between each loudspeaker unit of the vehicle-mounted reproduction system and the preset head center position is calculated according to the coordinate positional relationship, i.e., $$r_{FL,H}^{k=1} = 0.641 \text{ m}, r_{FL,M}^{k=1} = 0.693 \text{ m}, r_{FL,L}^{k=1} = 1.034 \text{ m}, r_{FR,H}^{k=1} = 1.137 \text{ m},$$
$$r_{FR,M}^{k=1} = 1.179 \text{ m}, r_{FR,L}^{k=1} = 1.131 \text{ m}, r_{FC,M}^{k=1} = 0.679 \text{ m}, ,$$
$$r_{BL}^{k=1} = 1.048 \text{ m}, r_{BR}^{k=1} = 1.442 \text{ m}, \text{and } r_{SW}^{k=1} = 1.749 \text{ m}.$$

S2: an impulse response from each loudspeaker unit to the initial listening center is measured and acquired, and an initial delay parameter set is extracted and obtained.

Figure 5:
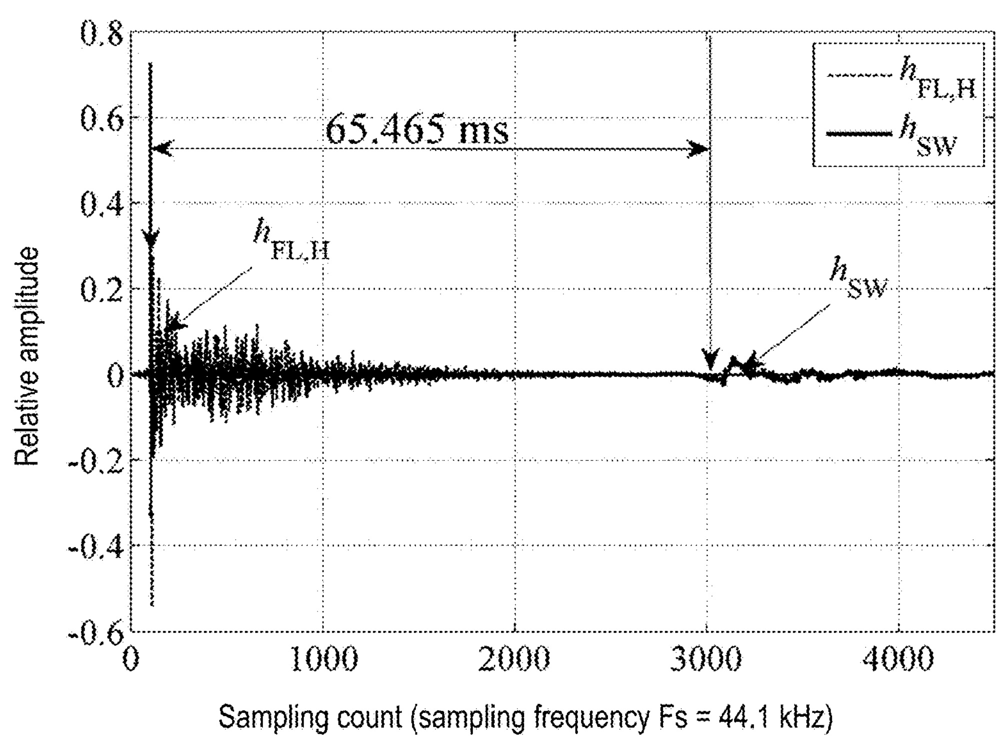
FIG. 5 is a schematic diagram of relative delays of impulse responses of a super bass loudspeaker and a high frequency loudspeaker on the left side of the front row.

In an embodiment, based on a room impulse response method, a 18-order MLS signal is used as a measuring signal, and the signal is subjected to reproduction by each loudspeaker in the automobile; a microphone (B&K 4192) is arranged at the head center position of the driver in the automobile, an output of the microphone subjected to A/D conversion by a preamplifier and a Fireface UC sound card is input into a notebook computer for storage to solve cross-correlation on the recorded signal and the original signal to obtain the impulse response of each channel, and the impulse response delays of the super bass loudspeaker and the high frequency loudspeaker in the front row are shown in FIG. 5, so that a transmission delay of the sound waves of the loudspeaker in each channel relative to $S_{FL,H}$ is further solved with a cross-correlation function, i.e., $$\tau_{FL,H}^{k=1} = 0 \text{ ms}, \tau_{FL,M}^{k=1} = 0.247 \text{ ms}, \tau_{FL,L}^{k=1} = 1.649 \text{ ms}, \tau_{FR,H}^{k=1} = 1.290 \text{ ms},$$
$$\tau_{FR,M}^{k=1} = 1.474 \text{ ms}, \tau_{FR,L}^{k=1} = 3.868 \text{ ms}, \tau_{FC}^{k=1} = -0.198 \text{ ms},$$
$$\tau_{BL}^{k=1} = -0.361 \text{ ms}, \tau_{BR}^{k=1} = 1.533 \text{ ms}, \text{and } \tau_{SW}^{k=1} = 65.465 \text{ ms}.$$

Individual delay negative values represent that there are certain deviations between the actually measured delays and the geometrical distances, so that the initial value is based on measurement.

S3: position coordinates of a new listening center are acquired in a specific manner, and a distance parameter set of each loudspeaker unit relative to the new listening center is acquired;

in an embodiment, body parameter data of a new listener (assuming a new testee with the sequence number of 1, n=1) is obtained by way of measurement; in another embodiment, body parameter data of the new listener is obtained by way of measurement or by way of manual input of a user through an interface, $h_1$=0.986 m, the equivalent head radius $a_1$=0.098 m, the backward distance of the seat $x_1$=0.100 m, the lifting distance of the seat $z_1$=0.020 m, and the seat back inclination angle $\varphi_1$ of the seat is 20° (forming an included angle with the z axis), so that coordinates) of the position $$C_{n=1}^{k=1}$$

of the first new listening center are approximated as (−0.404, 0, 0.834); and the distance between each loudspeaker unit of the vehicle-mounted reproduction system and the position of the first new listening center is calculated according to the coordinate positional relationship as follows:

$$|C_{n=1}^{k=1}S_{ij}| = r_{ij}^{nk}, r_{FL,H}^{n=1,k=1} = 0.736 \text{ m}, r_{FL,M}^{n=1,k=1} = 0.787 \text{ m},$$
$$r_{FL,L}^{n=1,k=1} = 1.115 \text{ m}, r_{FR,H}^{n=1,k=1} = 1.193 \text{ m}, , r_{FR,M}^{n=1,k=1} = 1.237 \text{ m}, ,$$
$$r_{FR,L}^{n=1,k=1} = 1.378 \text{ m}, r_{FC}^{n=1,k=1} = 0.768 \text{ m}, r_{BL}^{n=1,k=1} = 1.047 \text{ m},$$
$$r_{BR}^{n=1,k=1} = 1.440 \text{ m}, \text{and } r_{SW}^{n=1,k=1} = 1.696 \text{ m}.$$

S4: optimized delay parameters adapted to a new listener are generated based on the distance parameter set relative to the new listening center;

the optimized delay parameters adapted to the personalized listening center of the $n^{th}$ new listener are obtained according to the initial distance parameter set $$\{|C_0^k S_{ij}|\},$$

acquired in the step S1, the initial delay parameter set $$\{\tau_{ij}^k\} \text{ or } \{\tau_{iH}^k\}$$

acquired in the step S2, and the distance parameter set $$\{|C_n^k S_{ij}|\}$$

of each loudspeaker unit relative to the $n^{th}$ new listening center acquired in the step S3, as shown in the following equation:

$$\tau_{ij}^{nk} = (|C_0^k S_{ij}| - |C_n^k S_{ij}|)/c_0 + \tau_{ij}^k;$$

where $c_0$ represents a sound velocity in air, which is 340 m/s; in the embodiment, the optimized delay parameters of the personalized listening center adapted to the first new listener are specifically as follows:

$$\tau_{FL,H}^{n=1,k=1} = -0.279 \text{ ms}, \tau_{FL,M}^{n=1,k=1} = -0.252 \text{ ms},$$
$$\tau_{FL,L}^{n=1,k=1} = 1.411 \text{ ms}, \tau_{FR,H}^{n=1,k=1} = 1.125 \text{ ms}, \tau_{FR,M}^{n=1,k=1} = 1.303 \text{ ms},$$
$$\tau_{FR,L}^{n=1,k=1} = 3.142 \text{ ms}, \tau_{FC}^{n=1,k=1} = -0.460 \text{ ms}, \tau_{BL}^{n=1,k=1} = -0.358 \text{ ms},$$
$$\tau_{BR}^{n=1,k=1} = 1.539 \text{ ms}, \text{and } \tau_{SW}^{n=1,k=1} = 65.480 \text{ ms}.$$

With respect to the vehicle-mounted reproduction system, the delay can be integrally translated according to the demand of actual use, and then the reproduction delay of each channel is converted into a delay count (shown in FIG.

5) for compensation based on a sampling frequency (for example, 44100 Hz) of a sound source signal, so that the system is adapted to sound reproduction the new listening center.

With respect to the reproduction system, the delay can be integrally translated according to the demand of actual use, and then the reproduction delay of each channel is converted into a delay count (shown in FIG. 5) for compensation based on a sampling frequency (for example, 44100 Hz) of a sound source signal, so that the system is adapted to sound reproduction the new listening center.

Figure 6A:
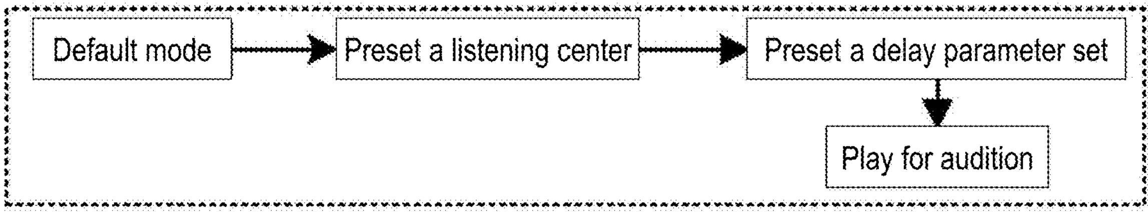
FIG. 6*a* is a schematic diagram of a default mode in an implementation process.
Figure 6B:
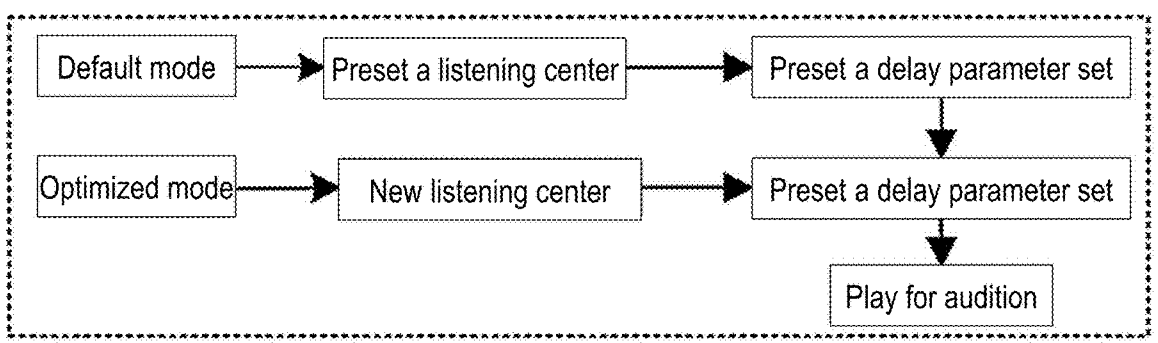
FIG. 6*b* is a schematic diagram of an optimized model in the implementation process.

In an embodiment, in a specific implementation process, as shown in FIG. 6*a*, a preferred listening center which is not adapted to the change of the new listening center but meets the ergonomic statistical characteristics of human based on the default mode with the preset listening center can be adopted; and in another embodiment, in the specific implementation process, an optimized mode dependent on the above software and hardware processing and adapted to different listeners can be adopted, which can be compatible with the default mode, as shown in FIG. 6*b*. It can be seen from the above optimized mode that the vehicle-mounted sound reproduction signal delay method adapted to the listening center can be adapted to sound reproduction in the automobile for different listeners. The present invention can adaptively select the optimum delay network to match different listeners so as to improve the vehicle-mounted stereo reproduction effect without the loss of the sound quality. Compared with a conventional standardized delay network, the reproduction effect is improved, and the present invention optimizes the auditory experience in the automobile.

Compared with the prior art, the present invention has the following advantages and beneficial effects:

1. The coordinate system is set and the listening center is preset, so that it complies with the ergonomic law to acquire the initial delay (a delay default value);
2. The position coordinates of the target listening center position can be rapidly acquired, and the delay parameter is further optimized based on the coordinate parameter set; and
3. By adopting delay post-processing of the vehicle-mounted sound reproduction signal adapted to the listening center position, personalized processing of reproduction signal delay can be performed according to different listeners, so that a better spatial sound field reproduction effect is achieved.

The embodiments are preferred modes of execution of the present invention. The modes of execution of the present invention are not limited by the embodiments. Any other changes, modifications, substitutions, combinations and simplifications made without departing from the spirit and principle of the present invention shall be equivalent substitute modes and shall come within the protection scope of the present invention.

What is claimed is:

1. A vehicle-mounted sound reproduction signal delay method adapted to a listening center position, comprising following steps:

S1: presetting a coordinate reference system to acquire coordinates of each loudspeaker unit, and setting position coordinates of an initial listening center to acquire an initial distance parameter set for signal processing of a vehicle-mounted sound reproduction system, wherein a coordinate system (O-xyz) of the vehicle-mounted sound reproduction system is preset without loss of generality, an origin O of coordinates is a center of a cushion of a driver seat placed at a foremost end and located at a lowest position, an x axis points to a front of the driver seat from the origin of coordinates, a y axis points to a passenger seat position from the origin of coordinates, and a z axis is perpendicular upwards;

S2: measuring and acquiring an impulse response from each loudspeaker unit to the initial listening center, and extracting and obtaining an initial delay parameter set;

S3: acquiring position coordinates of a new listening center in a specific manner, and acquiring a distance parameter set of each loudspeaker unit relative to the new listening center; and

S4: generating optimized delay parameters adapted to a new listener based on the distance parameter set relative to the new listening center.

2. The vehicle-mounted sound reproduction signal delay method adapted to the listening center position according to claim 1, wherein based on the coordinate system (O-xyz), coordinates $S_{ij}(x_{ij}, y_{ij}, z_{ij})$ of a center position of each loudspeaker unit are measured and acquired, and $x_{ij}$, $y_{ij}$, and $z_{ij}$ are spatial position coordinates of each loudspeaker unit in the coordinate system of the vehicle-mounted sound reproduction system in a compartment, wherein i represents a sequence number of different channel orientations, i={FR, FL, FC, BR, BL, SW, S}, FR, FL, FC, BR, BL, SW, and S respectively correspond to a front right loudspeaker, a front left loudspeaker, a front center loudspeaker, a back right loudspeaker, a back left loudspeaker, an sub-woofer loudspeaker, and other expandable loudspeaker units; j represents a frequency division sequence number of each channel, j={L, M, H}, and L, M, and H respectively correspond to a low frequency loudspeaker unit, a medium frequency loudspeaker unit, and a high frequency loudspeaker unit;

in the preset coordinate system (O-xyz), a position of the initial listening center is set as $$C_0^k(x_0^k, y_0^k, z_0^k),$$

wherein the driver seat corresponds to k=1, and a passenger seat corresponds to k=2; and according to a height $h_0$ of an upper part of a body of a human in a sitting posture, an equivalent head radius $a_0$, a seat back inclination angle $\varphi_0$, a back stroke $x_0$ of the seat and a lift $z_0$ of the seat, the coordinates of the initial listening center are jointly determined specifically as follows:

$$x_0^k = x_0 - (h_0 - a_0)\sin(\varphi_0),\ k = 1, 2,\ x_0 \le 0;$$

$$y_0^{(k=1)} = 0,\ y_0^{(k=2)} = -y_0,\ y_0 = \left|C_0^{(1)} C_0^{(2)}\right|;$$

$$z_0^k = z_0 + (h_0 - a_0)\cos(\varphi_0),\ k = 1, 2,\ z_0 \ge 0.$$

3. The vehicle-mounted sound reproduction signal delay method adapted to the listening center position according to claim 2, wherein the distance parameter set $$\{|C_0^k S_{ij}|\}$$

of each loudspeaker unit relative to the initial listening center is obtained according to a distance formula between coordinates of two points.

4. The vehicle-mounted sound reproduction signal delay method adapted to the listening center position according to claim 3, wherein in the step S2, under actions of a sound card and a power amplifier of the vehicle-mounted sound reproduction system, different loudspeaker units are driven in sequence with a same information source strength, so that a sound transmission characteristic, i.e., the impulse response, from each loudspeaker unit to the initial listening center position $$C_0^k$$

is measured; and the initial delay parameter set $$\{\tau_{ij}^k\}$$

is acquired based on the impulse response and is verified with the distance parameter set $$\{|C_0^k S_{ij}|\}$$

relative to the initial listening center, wherein k represents a target seat, i represents the sequence number of different channel orientations, and j represents the frequency division sequence number of each channel.

5. The vehicle-mounted sound reproduction signal delay method adapted to the listening center position according to claim 4, wherein if a relative delay between frequency division loudspeakers is not considered, the initial delay parameter set is a delay $$\{\tau_{iH}^k\}$$

of a high frequency channel, where i represents the sequence number of different channel orientations, k represents the target seat, and the frequency division sequence number j of each channel is equal to H.

6. The vehicle-mounted sound reproduction signal delay method adapted to the listening center position according to claim 5, wherein in the step S3, the position coordinates of the listening center corresponding to an $n^{th}$ new listener, i.e., the $n^{th}$ new listening center are acquired in a specific manner as $$C_n^k(x_n^k, y_n^k, z_n^k),$$

specifically as follows:

assuming that the height from both ears of the $n^{th}$ new listener to the cushion is $h_n$, the equivalent head radius is $a_n$, the seat back inclination angle is $\varphi_n$, the back stroke of the seat is $x_n$, and the lift of the seat is $z_n$, the coordinates of the listening center corresponding to the $n^{th}$ new listener are represented as:

$$x_n^k = x_n - (h_n - a_n)\sin(\varphi_n),\ k = 1, 2,\ x_n \le 0;$$

$$y_n^{(k=1)} = 0,\ y_n^{(k=2)} = -y_0,\ y_0 = |C_n^{(1)} C_n^{(2)}| = |C_0^{(1)} C_0^{(2)}|;$$

$$z_n^k = z_n + (h_n - a_n)\cos(\varphi_n),\ k = 1, 2,\ z_n \ge 0;$$

the distance parameter set $$\{|C_n^k S_{ij}|\}$$

of each loudspeaker unit relative to the $n^{th}$ new listening center are acquired based on the coordinates $$C_n^k(x_n^k, y_n^k, z_n^k)$$

of the listening center corresponding to the $n^{th}$ new listener and the coordinates $S_{ij}(x_{ij}, y_{ij}, z_{ij})$ of the center position of each loudspeaker unit.

7. The vehicle-mounted sound reproduction signal delay method adapted to the listening center position according to claim 6, wherein in the step S4, the optimized delay parameters adapted to the personalized listening center of the $n^{th}$ new listener are obtained according to the initial distance parameter set $$\{|C_0^k S_{ij}|\},$$

acquired in the step S1, the initial delay parameter $$\{\tau_{ij}^k\} \text{ or } \{\tau_{iH}^k\})$$

acquired in the step S2, and the distance parameter set $$\{|C_n^k S_{ij}|\}$$

of each loudspeaker unit relative to the $n^{th}$ new listening center acquired in the step S3, as shown in the following equation:

$$\tau_{ij}^{nk} = (|C_0^k S_{ij}| - |C_n^k S_{ij}|)/c_0 + \tau_{ij}^k;$$

wherein $c_0$ represents a sound velocity in air.

8. The vehicle-mounted sound reproduction signal delay method adapted to the listening center position according to claim 7, wherein when a delay difference between the frequency division loudspeaker units is not considered and only a high frequency channel delay is processed, the optimized delay parameters adapted to the personalized listening center of the $n^{th}$ new listener are:

$$\tau_i^{nk} = (|C_0^k S_{iH}| - |C_n^k S_{iH}|)/c_0 + \tau_{iH}^k.$$

9. The vehicle-mounted sound reproduction signal delay method adapted to the listening center position according to claim 1, wherein the optimized delay parameters are stored in the vehicle-mounted reproduction system, are measured and optimized as needed in actual use or are selected directly according to a usage record; and when the optimized delay parameters are not needed to be optimized, the initial delay parameter is taken as a default parameter.

10. The vehicle-mounted sound reproduction signal delay method adapted to the listening center position according to claim 2, wherein the optimized delay parameters are stored in the vehicle-mounted reproduction system, are measured and optimized as needed in actual use or are selected directly according to a usage record; and when the optimized delay parameters are not needed to be optimized, the initial delay parameter is taken as a default parameter.

11. The vehicle-mounted sound reproduction signal delay method adapted to the listening center position according to claim 3, wherein the optimized delay parameters are stored in the vehicle-mounted reproduction system, are measured and optimized as needed in actual use or are selected directly according to a usage record; and when the optimized delay parameters are not needed to be optimized, the initial delay parameter is taken as a default parameter.

12. The vehicle-mounted sound reproduction signal delay method adapted to the listening center position according to claim 4, wherein the optimized delay parameters are stored in the vehicle-mounted reproduction system, are measured and optimized as needed in actual use or are selected directly according to a usage record; and when the optimized delay parameters are not needed to be optimized, the initial delay parameter is taken as a default parameter.

13. The vehicle-mounted sound reproduction signal delay method adapted to the listening center position according to claim 5, wherein the optimized delay parameters are stored in the vehicle-mounted reproduction system, are measured and optimized as needed in actual use or are selected directly according to a usage record; and when the optimized delay parameters are not needed to be optimized, the initial delay parameter is taken as a default parameter.

14. The vehicle-mounted sound reproduction signal delay method adapted to the listening center position according to claim 6, wherein the optimized delay parameters are stored in the vehicle-mounted reproduction system, are measured and optimized as needed in actual use or are selected directly according to a usage record; and when the optimized delay parameters are not needed to be optimized, the initial delay parameter is taken as a default parameter.

15. The vehicle-mounted sound reproduction signal delay method adapted to the listening center position according to claim 7, wherein the optimized delay parameters are stored in the vehicle-mounted reproduction system, are measured and optimized as needed in actual use or are selected directly according to a usage record; and when the optimized delay parameters are not needed to be optimized, the initial delay parameter is taken as a default parameter.

16. The vehicle-mounted sound reproduction signal delay method adapted to the listening center position according to claim 8, wherein the optimized delay parameters are stored in the vehicle-mounted reproduction system, are measured and optimized as needed in actual use or are selected directly according to a usage record; and when the optimized delay parameters are not needed to be optimized, the initial delay parameter is taken as a default parameter.

* * * * *